(12) United States Patent
Arita et al.

(10) Patent No.: US 6,723,651 B2
(45) Date of Patent: Apr. 20, 2004

(54) PLASMA PROCESSING METHOD

(75) Inventors: Kiyoshi Arita, Munakata-gun (JP); Tetsuhiro Iwai, Kasuga (JP); Shoji Sakemi, Ogoori (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/036,485

(22) Filed: Jan. 7, 2002

(65) Prior Publication Data

US 2002/0090826 A1 Jul. 11, 2002

(30) Foreign Application Priority Data

Jan. 10, 2001 (JP) .......................... 2001-002196

(51) Int. Cl.$^7$ ........................... H01L 21/302; B44C 1/22
(52) U.S. Cl. ........................... 438/706; 438/711; 216/67
(58) Field of Search ................................. 438/710, 715, 438/716, 689, 706, 711; 216/58, 63, 67

(56) References Cited

U.S. PATENT DOCUMENTS 4,255,230 A * 3/1981 Zajac ........................... 156/643
5,575,887 A * 11/1996 Yoshida et al. ........... 156/643.1
6,110,836 A * 8/2000 Cohen et al. ................ 438/710
6,413,875 B1 * 7/2002 Blalock et al. ............. 438/714

* cited by examiner

Primary Examiner—Evan Pert
Assistant Examiner—Scott B. Geyer
(74) Attorney, Agent, or Firm—Parkhurst & Wendel, L.L.P.

(57) ABSTRACT

A method of plasma processing a silicon-containing object to be processed at a high etching rate without causing a surface of the object to have a hazy appearance, so that this surface can have an excellent visual quality. In the plasma processing method of etching the surface of the semiconductor wafer, gas containing sulfur hexafluoride and helium is used as a plasma-generating gas. A fluorine radical as an active substance which reacts with silicon of the surface of the semiconductor wafer, gaseous silicon tetrafluoride yielded by the reaction and a compound ($SF_n$) of fluorine and sulfur that is generated as a reaction product are removed by the helium gas functioning as carrier gas. The helium gas prevents the reaction product from adhering to the surface of the wafer again.

6 Claims, 3 Drawing Sheets

PLASMA PROCESSING METHOD

FIELD OF THE INVENTION

The present invention relates to a plasma processing method of etching a silicon-containing object to be processed such as a silicon substrate with a plasma.

BACKGROUND OF THE INVENTION

In a process of manufacturing a silicon substrate for a semiconductor device, the substrate is thinned during a thinning process. This thinning process is performed, subsequently to forming of a circuit pattern on the surface of the silicon substrate, by mechanically polishing a back side opposite to the circuit-formed side. The mechanical polishing forms a damaged layer including a micro-crack at the surface of the silicon substrate. To prevent strength of the silicon substrate from decreasing due to this damaged layer, etching is performed to remove the damaged layer after the mechanical polishing. As this etching, plasma etching is utilized instead of conventional wet etching using a chemical solution.

To achieve a higher etching rate, this plasma etching directed to silicon, gas including carbon tetrafluoride gas is used as plasma-generating gas. The carbon tetrafluoride gas is ionized or excited by a plasma discharge to form an ion and a radical, which etches the silicon surface.

In the plasma etching using the carbon tetrafluoride, a carbon-containing film, that is, a compound of fluorine and carbon, which is a product generated in a reaction caused by the plasma processing of the silicon surface, re-adheres to a portion of the silicon surface. This re-adhering compound prevents the plasma etching from being performed, reduces an overall etching rate, varies plasma etching effect depending upon the degree of the re-adhesion. Consequently, the etched surface has a hazy appearance and hence has reduced visual quality.

SUMMARY OF THE INVENTION

An exemplary embodiment of the presently claimed invention is a method of plasma-processing a silicon-containing object at a high etching rate while generating no hazy appearance on the surface of the object, thereby to have excellent visual quality.

This plasma-processing method includes mounting the object to be processed on a mounting unit disposed within a process chamber, generating a plasma by feeding plasma-generating gas including sulfur hexafluoride and helium into the process chamber and causing a plasma discharge, and etching the object with the generated plasma.

DESCRIPTION OF THE PREFERRED EMBODIMENT

Figure 1:
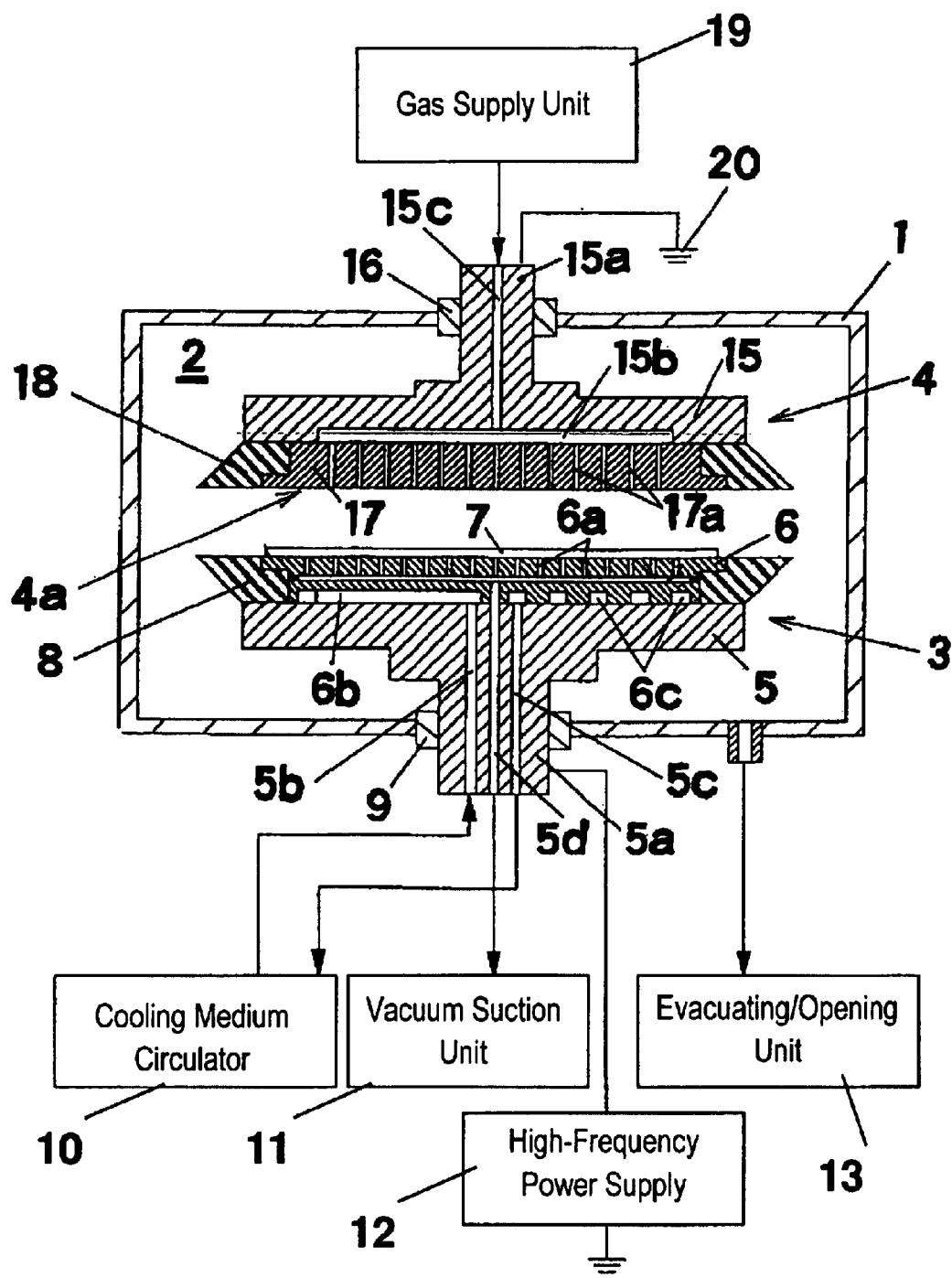
FIG. 1 is a cross section of a plasma-processing apparatus in accordance with an exemplary embodiment of the present invention.

FIG. 1 is a cross section of a plasma processing apparatus in accordance with an exemplary embodiment of the present invention, and FIGS. 2A, 2B, 3A and 3B illustrate processes in a plasma processing method in accordance with the embodiment.

Figure 2A:
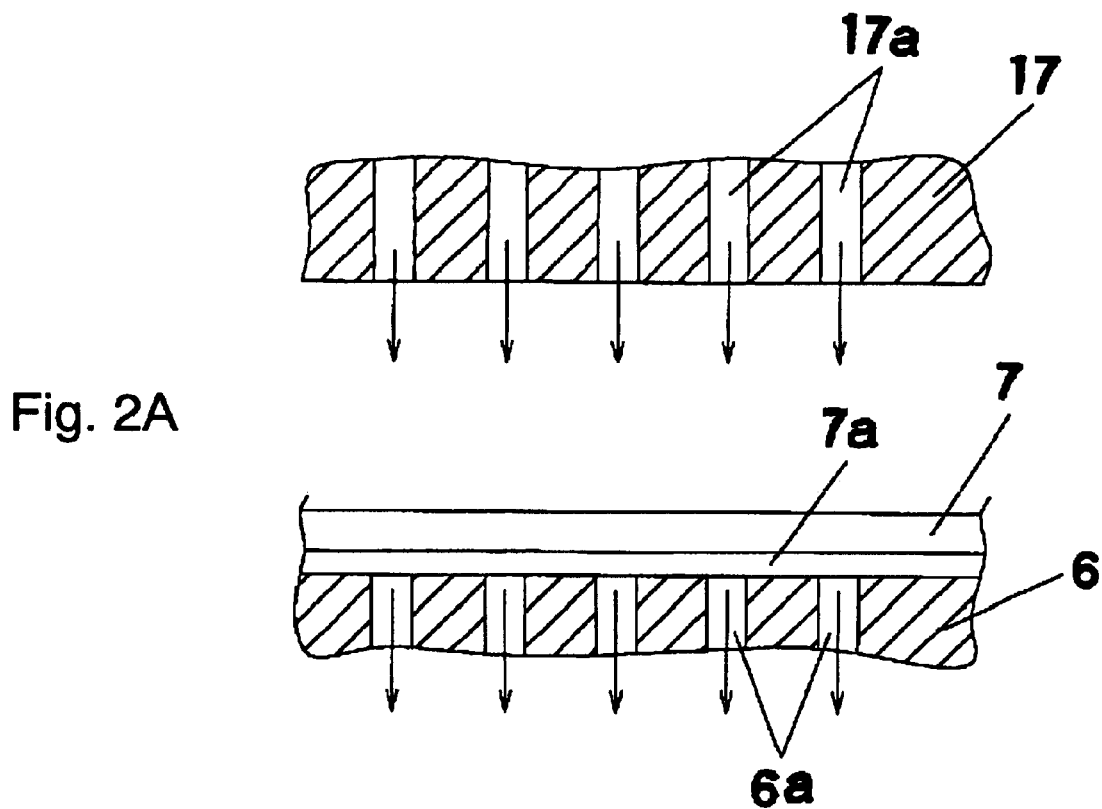
FIGS. 2A and 2B illustrate processes in a plasma-processing method in accordance with the embodiment.

Referring to FIG. 1, the plasma processing apparatus will be described below. The inside of a vacuum chamber 1 is a process chamber 2 for plasma processing. In this process chamber 2, a lover electrode assembly 3 and an upper electrode assembly 4 are arranged to be vertically opposed to each other. The lover electrode assembly 3 includes an electrode 5 mounted to the vacuum chamber 1 via an insulator 9 with a support unit 5a extending downwardly. A mounting unit 6 made of material having high thermal conductivity is mounted to the top surface of the electrode 5. On the top surface of the mounting member 6, a semiconductor wafer 7, a silicon-containing object to be processed, is mounted. This wafer 7 has a back side which has just been polished mechanically opposite to a circuit-formed side. The wafer 7, having a protective sheet 7a affixed to the circuit-formed side of the wafer 7, is mounted on the mounting unit 6 with the sheet contacting the unit 6 as shown in FIG. 2A and with the polished side facing upward.

The mounting unit 6 has plural suction holes 6a opening onto its top surface. These suction holes 6a communicate with suction passage 5d bored through the support unit 5a of the electrode 5. A suction passage 5d is connected to a vacuum suction unit 11. While being mounted on the top surface of the mounting unit 6, the wafer 7 is held with the mounting unit 6 through vacuum suction performed by the vacuum suction unit 11. The lower electrode assembly 3 having the electrode 5 and mounting unit 6 thus functions as holding means for holding the wafer 7.

Cooling medium channels 6b, 6c are provided inside mounting member 6 and communicate with respective pipelines 5b, 5c bored through the support unit 5a. Pipelines 5b, 5c are connected to a cooling medium circulator 10, and the circulator 10 is driven to circulate a cooling medium such as cooling water or the like through channels 6b, 6c to cool the mounting unit 6 heated during the plasma processing. Cooling the mounting unit 6 prevents the protective sheet 7a made of resin affixed to the circuit-formed side of the wafer 7 from melting with heat of the plasma.

The electrode 5 is connected to a high-frequency power supply 12. The process chamber 2 within vacuum chamber 1 is connected to an evacuating/opening unit 13. The unit 13 evacuates the process chamber 2 and opens process chamber 2 to atmospheric air when the vacuum is broken.

The upper electrode assembly (opposite electrode assembly) 4 includes an electrode 15 connected to a ground 20. The electrode 15 is mounted to the vacuum chamber 1 via an insulator 16 with a support unit 15a extending upward. An insulator 17 mounted to the bottom surface of the electrode 15 has plural gas ejection holes 17a communicating with a void 15b. In other words, the opposite surface 4a of the upper electrode assembly 4 facing the lower electrode assembly 3 has the gas ejection holes 17a formed therein for supplying plasma-generating gas. The holes 17a communicate with the void 15b inside the electrode 15. This void 15b is coupled to a gas supply unit 19 via a gas supply passage 15c bored through the support unit 15a. The insulator 17 may be made of a porous material having such gas ejection holes 17a formed therein randomly.

The gas supply unit 19 supplies gas containing sulfur hexafluoride ($SF_6$) and helium (He) mixed in a volume ratio ranging from 1:1 to 1:10 as the plasma-generating gas. The mixing ratio of sulfur hexafluoride to helium is determined primarily according to an etching rate and visual quality of the etched side (the polished side). A high mixing ratio of sulfur hexafluoride (i.e. $SF_6$:He=1:1), increases the etching rate and decreases the visual quality due to a hazy etched side. A low mixing ratio of sulfur hexafluoride (i.e., $SF_6$:He= 1:10) increases the visual quality with a mirror-like etched surface and decreases the etching rate.

The plasma-generating gas is ejected downward from the gas ejection holes 17a of the insulator 17 of the upper electrode assembly 4 by the gas supply unit 19 after evacuation of the process chamber 2 is performed by the evacuation/opening unit 13. While the plasma-generating gas is being ejected, the high-frequency power supply 12 applies a high-frequency voltage to the electrode 5 of the lower electrode assembly 3. Consequently, a plasma discharge occurs in a space between the upper electrode assembly 4 and the lower electrode assembly 3. Plasma generated by the plasma discharge performs the plasma-etching on the top surface of the semiconductor wafer 7 mounted on the mounting unit 6.

As shown in FIG. 1, the outwardly projecting insulator 8 is mounted to the outer edge of the mounting unit 6 of the lover electrode assembly 3. Similarly, the outwardly projecting insulator 18 is mounted to the outer edge of the insulator 17 of the upper electrode assembly 4. The insulators 8 and 18 suppress an abnormal discharge between respective edges of the upper electrode assembly 4 and the lower electrode assembly 3 during generating the plasma discharge in the space between the electrode assemblies 4 and 3, and thus allowing the plasma to be generated stably above the mounting unit 6 of the lower electrode assembly 3.

The processes of the plasma etching will be described below. As shown in FIG. 2A, the semiconductor wafer 7 with the protective sheet 7a affixed thereto is mounted on the mounting unit 6 of the lower electrode assembly 3 with being held by vacuum suction. After the process chamber 2 is evacuated, the plasma-generating gas is blown from the gas ejection holes 17a against the top side of wafer 7. While the gas is being blown, the high-frequency power supply 12 applies a high-frequency voltage between the lower and upper electrode assemblies 3 and 4, thus generating the plasma discharge in the space above the wafer 7.

Figure 2B:
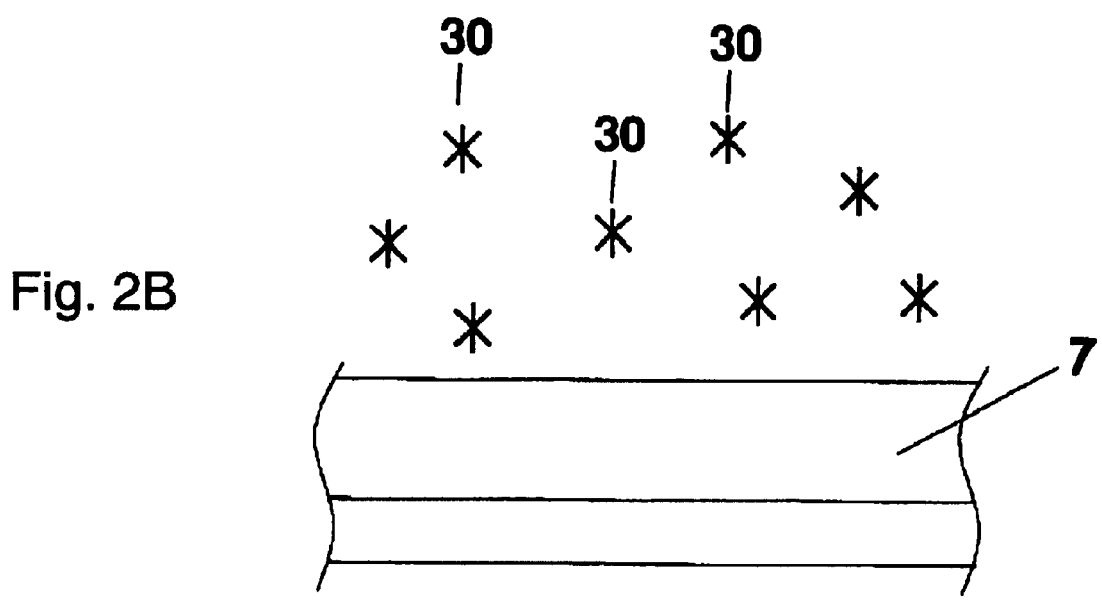
Figure 3A:
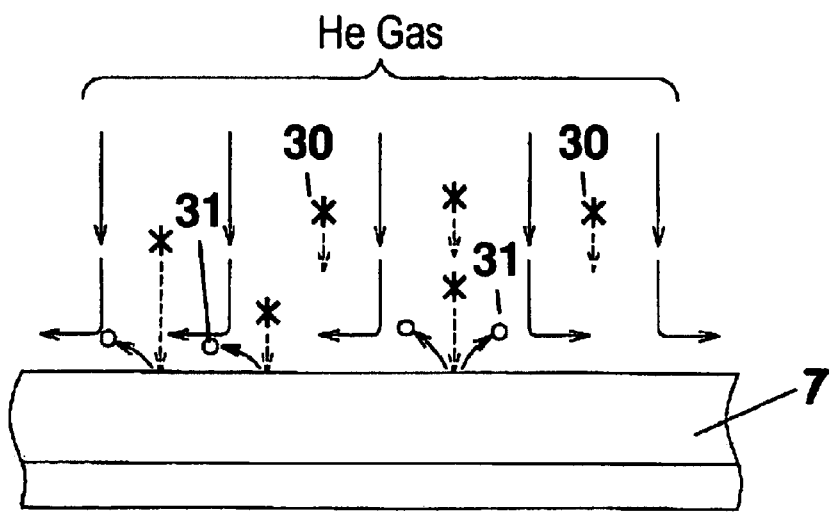
FIGS. 3A and 3B illustrate processes in the plasma processing method in accordance with the embodiment.

The plasma discharge generated in the mixed gas containing $SF_6$ generates fluorine radicals 30 as shown in FIG. 2B. The flow of helium gas (indicated by arrows) in the plasma-generating gas causes the fluorine radicals 30 to blow against the surface of the wafer 7. The fluorine radical 30 affects the silicon, which is contained in the wafer 7, for changing the silicon into gaseous silicon tetrafluoride 31, which transpires from the surface of the wafer 7, as shown in FIG. 3A, and is removed from the surface by the flow of the helium gas.

Figure 3B:
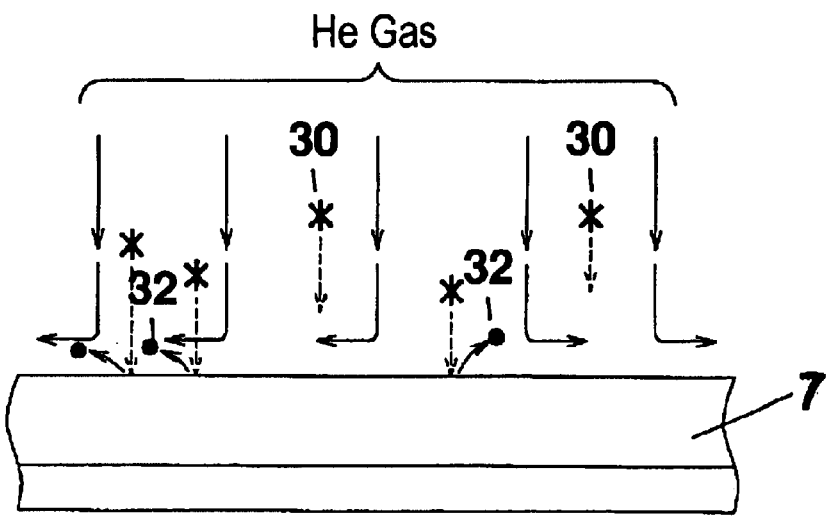

Concurrently with this reaction, sulfur fluoride ($SF_n$) 32, a compound of fluorine and sulfur, is generated as a reaction product. Similarly, the reaction product is removed, as shown in FIG. 3B, by the flow of the helium gas blown against the surface of the wafer 7, without remaining and accumulating on the surface of the wafer 7.

In other words, in the plasma processing described in the present embodiment, the helium gas contained in the plasma-generating gas blows the fluorine radical 30 generated by the plasma discharge against the silicon surface (the surface to be processed) of the semiconductor wafer 7, and functions as carrier gas for removing, from the surface of the wafer 7, gaseous silicon tetrafluorides ($SiF_4$) yielded by the reaction of the fluorine radical 30 and silicon and sulfur fluorides ($SF_n$) yielded by the reaction.

Thus, the reaction products, which are likely to remain and accumulate on the surface to be processed of the wafer 7 after the reaction for removing the silicon, can be removed without fail. Accordingly, an overall etching rate, which is affected by such reaction products remaining on the surface to be processed, does not decrease, and variation in the etching effect caused by reaction products remaining and clustering on the surface to be processed does not take place during etching.

For the above reason, the etched surface of the wafer 7 does not have such reduced visual quality in which the etched surface has a hazy appearance as a result of the variation in the etching effect. In addition, the sulfur hexafluoride ($SF_6$) as the plasma-generating gas can improve the rate of removing the silicon from the silicon surface, that is, the etching rate because the sulfur hexafluoride has more fluorine atoms per molecule than conventional gas, i.e., carbon tetrafluoride ($CF_4$).

It is known that the helium gas requires a lower minimum voltage for initiating a discharge than other gas. The sulfur hexafluoride ($SF_6$) requires a high minimum voltage for initiating to discharge. Therefore, only sulfur hexafluoride at a pressure not less than several hundreds of Pa generates a discharge only in an area under a strong electric field even if the high frequency voltage is applied between the parallel plate electrodes, and thus, generates variation in etching distribution. For this reason, the helium gas, which easily discharges, is mixed, thereby realizing highly uniform etching even with a low high-frequency voltage or a low high-frequency power.

In this plasma processing, a damaged layer including a micro-crack formed at the polished side in the previous mechanical polishing process can be removed efficiently. The plasma processing terminates when the semiconductor wafer 7 to which the plasma processing has performed is transferred from the process chamber 2 after released from the vacuum suction with the mounting unit 6.

Further, the plasma-generating gas is supplied from the plural gas ejection holes 17a formed at the opposite surface 4a of the opposite electrode assembly (upper electrode assembly) 4 facing to the lower electrode assembly 3. Therefore, the gas can be distributed evenly all over the polished side of the wafer 7. Simultaneously, the gas such as $SiF_4$, $SF_n$, and others that are yielded by the reaction is removed efficiently from the polished side, so that the processing may be performed at a high etching rate.

What is claimed is:

1. A plasma-processing method for forming a mirror-like etched surface on an object, said method comprising:

providing an apparatus comprising:
  a process chamber;
  a mounting unit located in the process chamber and for holding an object having a surface to be etched; and
  an electrode located in the processing chamber and facing the mounting unit, the electrode having a hole therein, the hole opening towards the mounting unit;
mounting an object on the mounting unit;
generating a plasma by blowing a plasma-generating from the hole to a surface of the object to be etched and causing a plasma discharge by applying a high frequency voltage between the mounting unit and the electrode, the plasma-generating gas containing a first amount of sulfur hexafluoride and a second amount of helium, the plasma-generating gas containing more helium than sulfur hexafluoride;
etching said surface with the generated plasma, thereby forming at least one reaction product; and
removing said at least one reaction product from said surface by blowing the plasma generating gas onto said surface simultaneously with etching of said surface until said surface becomes mirror-like.

2. The plasma-processing method of claim 1, wherein the object is a wafer having layer at the surface to be etched, and said etching of said surface comprises removing the damaged-layer.

3. The plasma-processing method of claim 2, wherein the wafer includes a protective sheet affixed to a second surface of the wafer, and the etching occurs when the wafer with the protective sheet is mounted on the mounting unit.

4. The plasma-processing method of claim 3, wherein etching the wafer further comprises etching the wafer while cooling the mounting unit.

5. The plasma-processing method of claim 1, wherein the first amount of helium in the plasma-generating gas is not greater than ten times the second amount of sulfur hexafluoride in the plasma-generating gas.

6. The plasma-processing method of claim 1, wherein removing said at least one reaction product comprises causing the helium in the plasma-generating gas to remove said at least one reaction product from the etched object.

\* \* \* \* \*